March 27, 1956 W. STRICKER 2,740,048
SPURIOUS FREQUENCY SUPPRESSION CIRCUIT
Filed Dec. 8, 1953
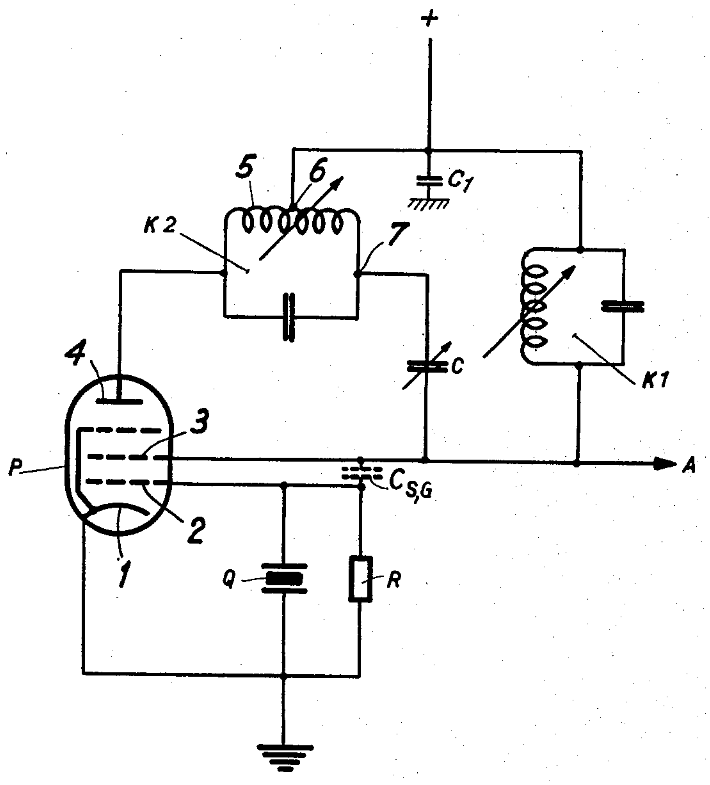

2,740,048

SPURIOUS FREQUENCY SUPPRESSION CIRCUIT

Walter Stricker, Riedholz, Switzerland, assignor to Autophon A. G., Solothurn, Switzerland Application December 8, 1953, Serial No. 396,971

Claims priority, application Switzerland December 16, 1952

8 Claims. (Cl. 250—36)

This invention relates to spurious frequency suppression circuits and more particularly to such circuits which are used for oscillating networks with an oscillator including a pentode.

In transmitting and receiving apparatus for communication, which alternately serve for the transmission and the reception of wireless signals over different frequencies and have a common variable frequency oscillator, the frequency of this oscillator must be mixed either with the reception frequencies to form the intermediate frequency or with the frequency of a local oscillator to form the transmission carrier frequency. This arrangement has, however, the drawback that the harmonics developed in the local oscillator have frequencies which are very near or even equal to the transmission frequency. Furthermore, if the apparatus is operated over a wide frequency range, this drawback cannot be avoided.

The main object of this invention is to overcome this drawback and to provide a circuit which enables the suppression of the unwanted harmonic frequencies in an oscillator network including a pentode.

According to the invention, the screen of the pentode is connected to the tank circuit of the oscillator and the plate of the pentode is connected to an oscillating circuit tuned to the harmonic frequency to be suppressed. From this oscillating circuit a voltage 180° out of phase with respect to the harmonic frequency developed at the oscillator output is derived and applied to the oscillator output. The inductance coil of the oscillating circuit tuned to the unwanted frequency has a center tap held at a constant potential with regard to the oscillations of the oscillator.

The novel features of this invention will be better understood by the following description, made with reference to the accompanying drawing, which diagrammatically indicates the circuit according to the invention.

Referring to the drawing there is shown a circuit comprising a pentode P with cathode 1, grid 2, screen 3 and plate 4. The grid 2 is connected to a crystal oscillator Q which is tuned to the frequency $f$. The capacity between the screen 3 and the grid 2 is indicated by $C_{SG}$ and R is the usual leak resistor of the grid 2. The screen 3 is connected to the output A of the circuit and the positive supply voltage is applied to the screen through the tank circuit K1, which is tuned to the same frequency $f$ as the crystal Q. Another oscillating circuit K2 is connected through capacitor C between the plate 4 and the screen 3 of the pentode P. This oscillating circuit is tuned to the frequency $nf$ of the unwanted harmonic produced in the tank circuit. The positive supply voltage is applied to the center tap 6 of the inductance coil 5 of circuit K2.

The operation of the circuit is as follows. The oscillating circuit consisting of the pentode P, the tank circuit K1, the crystal Q and the resistor R is well known to those skilled in the art. However, the circuit according to this invention differs from these known arrangements in that the screen 3 of pentode P instead of the plate 4 is connected to the output of the circuit.

The crystal Q is caused to oscillate by the screen-grid capacity $C_{SG}$. The resistor R serves, in a manner well known to those skilled in the art, to secure the bias of the grid.

The oscillator voltage, which is derived from the screen, appears also at the plate 4 of the pentode P. The oscillating circuit K2 connected to the plate is tuned to the unwanted frequency produced in the tank circuit K1. It is known that in an oscillating circuit the potentials appearing at the opposite terminals of the inductance coil are 180° out of phase. Therefore, since the center tap 6 of the inductance coil 5 of the oscillating circuit K2 is grounded through capacitor C, the terminals of this coil can oscillate with respect to ground. The plate voltage and the screen voltage are in phase. The circuit K2 is now caused to oscillate by the unwanted frequency superimposed on the plate. From the point 7 of circuit K2, where the voltage of the oscillations is 180° out of phase with respect to the oscillations at the plate and the screen, this voltage is derived and impressed, through capacitor C, to the circuit of the screen.

If a mixer stage is connected to the oscillator output, to avoid the unwanted harmonic frequency in the mixer stage output it will not suffice that this frequency does not appear at the oscillator output, since due to the non-linearity of the mixer stage, the unwanted frequency is produced again in this stage.

If now the amplitude of the unwanted harmonic voltage applied to the oscillator output is taken higher than that of unwanted harmonic voltage present thereat, the latter forms a component of the resulting output voltage of the oscillator but is 180° out of phase with respect to the harmonic voltage produced by the distortions.

Such an opposite phase component which is not eliminated in the mixer stage, will compensate the voltage of the spurious harmonic developed in the mixer stage, so that the mixer stage output no longer comprises the unwanted frequency.

If the oscillator output is not connected to any non-linear circuit element, the amplitude of the compensating voltage may be taken as high as the amplitude of the normally developed harmonic voltage, so that it may be completely compensated.

The suitable amplitude of the voltage impressed on the oscillator output may be determined by operating circuit K2 near its resonance condition and adjusting the amplitude of the voltage to the desired value for example through a variable inductance or capacitor.

The arrangement shown and described enables a voltage difference between the desired and undesired frequencies as high as 80 db to be obtained, in comparison with the voltage difference of 15 db which could usually be obtained wtihout the compensating circuit according to the present invention.

What is claimed is:

1. An oscillator comprising an electron tube having a plate, a cathode, a control grid, a screen grid, and a suppressor grid, resonant circuit means connected between the control grid and the cathode for determining the oscillation frequency of the oscillator, a tank circuit connected between the screen grid and the cathode, high frequency power output means connected to said tank circuit, a parallel resonant circuit connected between the plate and the screen grid, said parallel resonant circuit being tuned to an unwanted harmonic of the desired oscillation frequency, said parallel resonant circuit including an inductance coil and means for fixing the potential of an intermediate tap on said coil, means for deriving voltages from the parallel resonant circuit which are substantially 180° out of phase with the unwanted frequency voltages in the output means and applying the derived voltages to the output means, the magnitude of the derived voltages being greater than the value required for the compensation of the unwanted frequency voltages in the output means.

2. An oscillator according to claim 1 wherein said tank circuit is resonant at the same frequency as the resonant circuit means and said parallel resonant circuit is tuned to a harmonic of the resonant frequency of the tank circuit.

3. An oscillator comprising an electron tube having a plate, a cathode, a control grid and a screen grid, resonant circuit means connected between the control grid and the cathode for determining the oscillation frequency of the oscillator, a tank circuit connected between the screen grid and the cathode, high frequency power output means connected to said tank circuit, a parallel resonant circuit connected between the plate and the screen grid, said parallel resonant circuit being tuned to an unwanted harmonic of the desired oscillation frequency, said parallel resonant circuit including an inductance coil and means for fixing the potential of an intermediate tap on said coil, means for deriving voltages from the parallel resonant circuit which are substantially 180° out of phase with the unwanted frequency voltages in the output means and applying the derived voltages to the output means.

4. An oscillator according to claim 3 wherein the magnitude of the voltages derived from the parallel resonant circuit are substantailly equal to the value required for the compensation of the unwanted frequency voltages in the output means.

5. An oscillator comprising an electron tube having plate, cathode, control grid and screen grid electrodes, resonant circuit means connected between two of said electrodes for determining the oscillation frequency of the oscillator, a load circuit connected between the screen grid and the cathode, high frequency power output means connected to said load circuit, a parallel resonant circuit connected to the plate, said parallel resonant circuit being tuned to an unwanted harmonic of the desired oscillation frequency, and means for deriving voltages from the parallel resonant circuit which are out of phase with the unwanted frequency voltages in the output means and applying the derived voltages to the output means.

6. An oscillator according to claim 5 including means for varying the magnitude of the derived voltages applied to the output means.

7. An oscillator having a circuit for suppressing an unwanted output frequency, comprising an electron tube having a cathode, a plate, a control grid and screen grid, an oscillatory circuit connected between the screen grid and ground, an output load connected to the screen grid, a second oscillatory circuit tuned to the unwanted frequency and connected between the plate and ground, means for deriving from said second oscillatory circuit a voltage of the unwanted frequency which is out of phase with the unwanted frequency voltage on the output load and applying the derived voltage to the output load.

8. An oscillator including a pentode tube, a tank circuit connected between the screen grid and cathode of said tube, and means for suppressing oscillations of an unwanted frequency in said tank circuit, said means including a resonant circuit tuned to the unwanted frequency and connected to the anode and means connecting the resonant circuit to the tank circuit for impressing oscillations thereon substantially 180° out of phase with the unwanted frequency oscillations in the tank circuit.

References Cited in the file of this patent

UNITED STATES PATENTS

| | | |
|---|---|---|
| 2,044,137 | Tunick | June 16, 1936 |
| 2,051,936 | Braaten | Aug. 25, 1936 |
| 2,103,655 | Whittaker | Dec. 28, 1937 |